(12) United States Patent
Lee

(10) Patent No.: US 8,629,497 B2
(45) Date of Patent: Jan. 14, 2014

(54) SEMICONDUCTOR DEVICES AND METHODS OF FABRICATING THE SAME

(75) Inventor: Sangeun Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/469,333

(22) Filed: May 11, 2012

(65) Prior Publication Data

US 2012/0292697 A1   Nov. 22, 2012

(30) Foreign Application Priority Data

May 18, 2011 (KR) .......................... 10-2011-0046958

(51) Int. Cl.
*H01L 29/78* (2006.01)
(52) U.S. Cl.
USPC ............. 257/339; 257/E29.255; 257/E29.261
(58) Field of Classification Search
USPC ............. 257/E29.255, E21.409, E21.41, 288, 257/43, E29.262, E27.062, E29.2, 56, 330
See application file for complete search history.

(56) References Cited

U.S. PATENT DOCUMENTS

| | | | |
|---|---|---|---|
| 5,977,592 A | 11/1999 | Baba | |
| 6,991,983 B2 | 1/2006 | Shin | |
| 7,417,298 B2 | 8/2008 | Depetro et al. | |
| 2004/0241941 A1 | 12/2004 | Shin | |
| 2006/0138549 A1* | 6/2006 | Ko | 257/368 |
| 2006/0270162 A1* | 11/2006 | Lin et al. | 438/275 |
| 2006/0286757 A1* | 12/2006 | Power et al. | 438/305 |
| 2009/0242942 A1 | 10/2009 | Zhu et al. | |
| 2010/0163991 A1 | 7/2010 | Kim et al. | |

FOREIGN PATENT DOCUMENTS

| | | |
|---|---|---|
| JP | 09-252116 A | 9/1997 |
| JP | 10-223775 A | 8/1998 |
| KR | 10-1998-0070010 A | 10/1998 |
| KR | 10-2004-0003115 A | 1/2004 |
| KR | 10-2004-0103593 A | 12/2004 |
| KR | 10-2006-0077010 A | 7/2006 |

\* cited by examiner

*Primary Examiner* — Mary Wilczewski
*Assistant Examiner* — Paul Patton
(74) *Attorney, Agent, or Firm* — Lee & Morse, P.C.

(57) ABSTRACT

A semiconductor device includes a substrate having first and second regions, a device isolation layer on the substrate defining an active region in each of the first and second regions, a gate pattern on the active region of each of the first and second regions, and a first dopant region and a second dopant region in each of the first and second regions of the substrate, the gate pattern in each of the first and second regions being between respective first and second dopant regions. At least one of upper surfaces of the first and second dopant regions in the second region is lower in level than an upper surface of the substrate under the gate pattern in the second region, the first and second dopant regions in the second region having an asymmetric recessed structure with respect to the gate pattern in the second region.

13 Claims, 14 Drawing Sheets

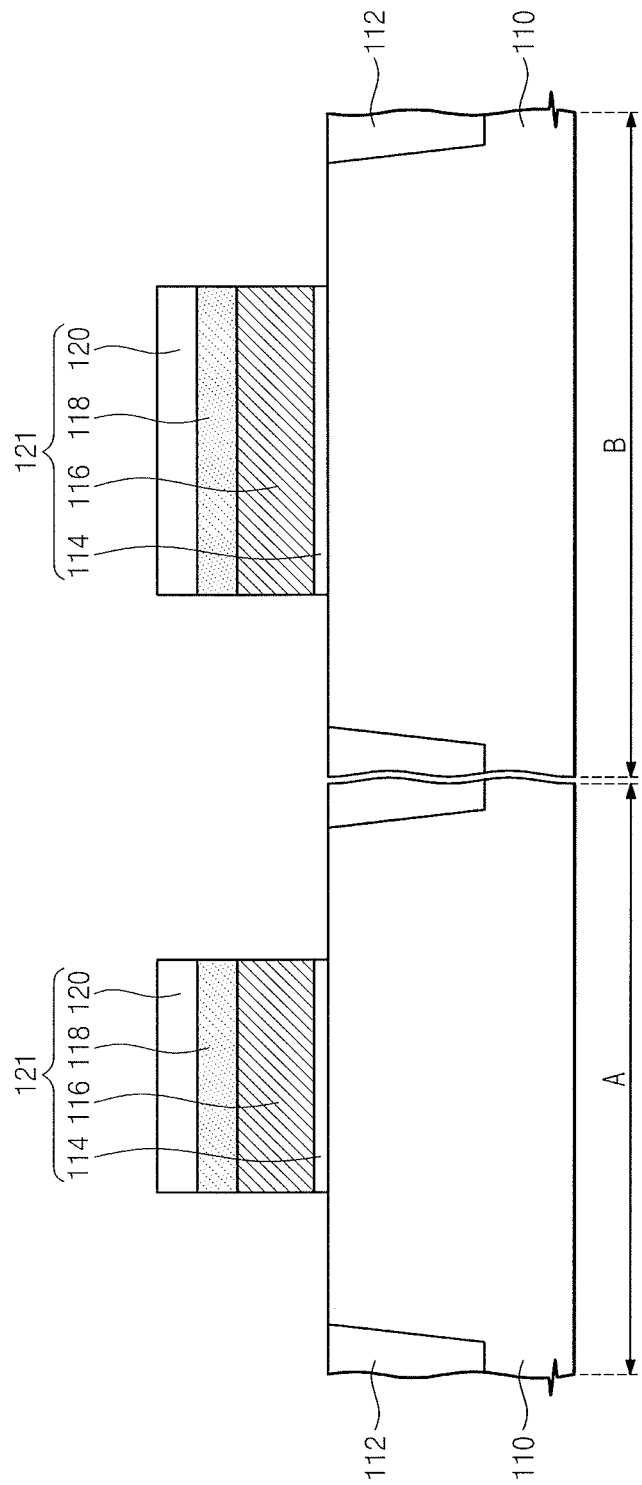

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2011-0046958, filed on May 18, 2011, the entire contents of which are incorporated by reference herein.

BACKGROUND

1. Field

The present disclosure herein relates to semiconductor devices and, more particularly, to semiconductor devices including a transistor with improved withstand voltage characteristic for a high voltage and methods of fabricating the same.

2. Description of the Related Art

Semiconductor devices, e.g., flash memory devices, requiring high voltage for programming and erasing operations may include high voltage transistors as well as low voltage transistors. Transistors with spacers may be disposed in a peripheral circuit region of such semiconductor devices.

SUMMARY

Embodiments of the inventive concept may provide semiconductor devices with improved withstand voltage characteristic for a high voltage.

Embodiments of the inventive concept may also provide methods of fabricating semiconductor devices with improved withstand voltage characteristic for a high voltage.

According to example embodiments of the inventive concepts, a semiconductor device may include a substrate including a first region and a second region, a device isolation layer on the substrate, the device isolation layer defining an active region in each of the first and second regions, a gate pattern on the active region of each of the first and second regions, and a first dopant region and a second dopant region in each of the first and second regions of the substrate, the gate pattern in each of the first and second regions being between respective first and second dopant regions, wherein at least one of upper surfaces of the first and second dopant regions in the second region is lower in level than an upper surface of the substrate under the gate pattern in the second region, the first and second dopant regions in the second region having an asymmetric recessed structure with respect to the gate pattern in the second region.

The first region and the second region may be a low voltage region and a high voltage region, respectively.

The first dopant region and the second dopant region may be a source region and a drain region, respectively.

An upper surface of the drain region may be lower in level than an upper surface of the source region.

The semiconductor device may further include spacers on sidewalls of each of the gate patterns.

The semiconductor device may further include at least one recessed region adjacent the gate pattern in the second region, the at least one of the first and second dopant regions with the lower upper surface than the substrate being in the recessed region, and a spacer on a sidewall of the gate pattern adjacent the recessed region extending along a sidewall of the recessed region.

The gate pattern may include a conductive layer and a capping layer on the conductive layer, the capping layer having a width narrower than a width of the conductive layer.

The conductive layer may include a lower conductive pattern, an insulating pattern on the lower conductive pattern, and an upper conductive pattern on the insulating pattern, the upper conductive pattern penetrating the insulating pattern to be electrically connected to the lower conductive pattern.

A distance between a bottom of the substrate and the upper surface of the at least one lower dopant region may be smaller than a distance between the bottom of the substrate and the upper surface of the substrate.

The upper surfaces of the first and second dopant regions in the second regions may be at different heights relative to a bottom of the substrate.

According to example embodiments of the inventive concepts, a semiconductor device may also include a substrate including a first region and a second region, a first gate pattern on the first region, the first gate pattern being between a first dopant region and a second dopant region, and a second gate pattern on the second region, the second gate pattern being between a third dopant region and a fourth dopant region, at least one of the third and fourth dopant regions being in a recessed region of the substrate, and heights of upper surfaces of the third and fourth dopant regions relative to a bottom of the substrate being different from each other.

At least one of the upper surfaces of the third and fourth dopant regions in the second region may be lower in level than an upper surface of the substrate under the gate pattern in the second region.

The first region and the second region may be a low voltage region and a high voltage region, respectively, and the at least one of the third and fourth dopant regions with the lower upper surface being a drain region.

According to example embodiments of the inventive concepts, a method of fabricating a semiconductor device may include forming a device isolation layer on a substrate including a first region and a second region to define an active region in each of the first and second regions, forming a gate pattern on the active region of each of the first and second regions, and forming a first dopant region and a second dopant region in each of the first and second regions of the substrate, the gate pattern in each of the first and second regions being between respective first and second dopant regions, wherein at least one of upper surfaces of the first and second dopant regions in the second region is lower in level than an upper surface of the substrate under the gate pattern in the second region, the first and second dopant regions in the second region having an asymmetric recessed structure with respect to the gate pattern in the second region.

Forming the first and second dopant regions may include recessing the upper surface the substrate in the active region adjacent the gate pattern in the second region to be lower in level than that of the substrate under the gate pattern.

The first dopant region and the second dopant region may be a source region and a drain region, respectively.

Forming the first and second dopant regions in the second region may include recessing the upper surface of the substrate, such that an upper surface of the drain region is lower than an upper surface of the source region.

The first region and the second region may be a low voltage region and a high voltage region, respectively.

The method may further include forming spacers on sidewalls of each of the gate patterns.

Forming the spacers may include forming a first spacer to extend continuously along a sidewall of the gate pattern in the second region and along a sidewall of a recessed region adjacent the gate pattern, a drain region being formed in the recessed region.

BRIEF DESCRIPTION OF THE DRAWINGS

Features will become apparent to those of ordinary skill in the art by describing in detail exemplary embodiments with reference to the attached drawings, in which:

FIGS. 7A to 7E illustrate cross sectional views of stages in a method of fabricating a semiconductor device according to another embodiment of the inventive concept.

DETAILED DESCRIPTION

Figure 1:
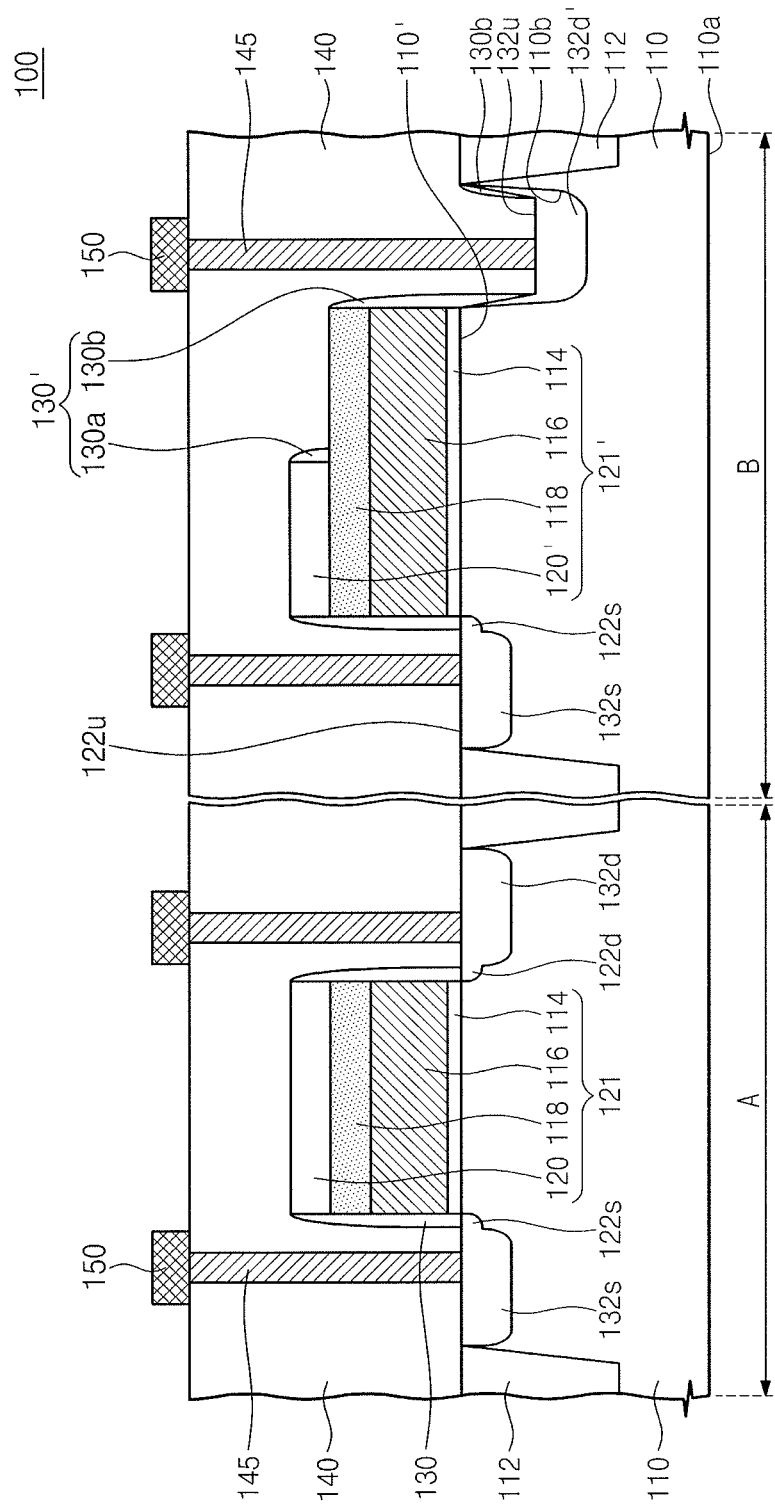
FIGS. 1 to 5 illustrate cross sectional views of semiconductor devices according to embodiments of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items.

It will also be understood that when an element, e.g., a layer, is referred to as being "on," "connected to," or "coupled to" another element, it may be directly on, connected to, or coupled to the other element or intervening elements may be present. In addition, it will also be understood that when an element is referred to as being "between" two elements, it can be the only element between the two elements, or one or more intervening element may also be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. Like reference numerals refer to like elements throughout.

FIG. 1 illustrates a cross sectional view of a semiconductor device according to an embodiment of the inventive concept. Referring to FIG. 1, a semiconductor device 100 may include transistors. A substrate 110 may have a first region A and a second region B. A device isolation layer 112 may be disposed on the substrate 110 to define active regions in the first and second regions A and B, respectively. Gate patterns 121 and 121' may cross over the respective active regions in the first and the second regions A and B, respectively. The gate pattern 121' in the second region B may be substantially the same as the gate pattern 121 in the first region A, with the exception of the structures of the capping layer and spacers, as will be discussed in more detail below The first region A and the second region B may be a low voltage region and a high voltage region in a peripheral circuit region of the semiconductor device 100, respectively. The low voltage region and the high voltage region may include a low voltage transistor and a high voltage transistor, respectively. The voltage applied to the high voltage transistor may be higher than a voltage applied to the low voltage transistor.

The active region in each of the first and second regions A and B may be defined by the device isolation layer 112. The substrate 110 may be, e.g., a silicon substrate. In the first region A, a first dopant region 122s and 132s and a second dopant region 122d and 132d may be disposed in the substrate 110 of the active region at both sides of the gate pattern 121, respectively. The first dopant region 122s and 132s and the second dopant region 122d and 132d in the first region A may be a source region and a drain region, respectively. The source region 122s and 132s in the first region A may consist of a low concentration source region 122s and a high concentration source region 132s. The drain region 122d and 132d in the first region A may consist of a low concentration drain region 122d and a high concentration drain region 132d. For example, the gate pattern 121 may be arranged between the low concentration source and drain regions 122s and 122d.

In the second region B, a first dopant region 122s and 132s and a second dopant region 132d' may be disposed in the substrate 110 of the active region at both sides of the gate pattern 121', respectively. The first dopant region 122s and 132s and the second dopant region 132d' in the second region A may be a source region and a drain region, respectively. The source region 122s and 132s in the second region B may consist of a low concentration source region 122s and a high concentration source region 132s. The drain region 132d' in the second region B may be substantially a high concentration drain region. Alternatively, although not shown, the drain region 132d' in the second region B may consist of the low concentration drain region and a high concentration drain region as the drain region 122s and 132s in the first region A.

At least one of upper surfaces of the source region 122s and 132s and the drain region 132d' in the second region B may be recessed to be lower in level than an upper surface of the substrate 110 under the gate pattern 121'. For example, as illustrated in FIG. 1, an upper surface 132u of the drain region 132d' in the second region B may be recessed to be lower in level than an upper surface 110' of the substrate 110, i.e., a distance between a bottom 110a of the substrate 110 and the upper surface 110' of the substrate 110 may be larger than a distance between the bottom 110' and the upper surface 132u of the drain region 132d'. The recessed upper surface 132u of the drain region 132d' in the second region B may be lower in level than an upper surface 122u the source region 122s and 132s in the second region B. That is, in the second region B, the drain region 132d' and the source regions 122s and 132s may have upper surfaces at different levels to define asymmetric recessed structures with the respect to the gate pattern 121'.

However, the inventive concept is not limited thereto. For example, the upper surface 122u of the source region 122s and 132s in the second region B may also be recessed. In this case, the recessed upper surface 132u of the drain region 132d' in the second region B may be still lower in level than the recessed upper surface 122u of the source region 122s and 132s in the second region B. That is, in the second region B, the drain region 132d' and the source regions 122s and 132s may have recessed structures that are asymmetric with the respect to the gate pattern 121'.

The gate pattern 121 may include a gate insulating layer 114, a gate electrode 116, a silicide layer 118, and a capping layer 120 sequentially stacked on the substrate 110. The gate insulating layer 114 may include, e.g., silicon oxide and/or a high-k dielectric material. The silicon oxide of the gate insulating layer 114 may be formed using a wet thermal oxidation process, a dry thermal oxidation process, and/or a chemical vapor deposition (CVD) process. The high-k dielectric material in the gate insulating layer 114 may have a dielectric constant higher than that of silicon oxide. The dielectric constant of the high-k dielectric material may be equal to or larger than 10. For example, the high-k dielectric material may include an oxide having at least one metal, e.g., hafnium (Hf), zirconium (Zr), aluminum (Al), titanium (Ti), lanthanum (La), yttrium (Y), gadolinium (Gd), and/or tantalum (Ta), a silicate, etc. The gate insulating layer 114 including the high-k dielectric material may be single layered or multi layered.

In case that the gate insulating layer 114 includes the high-k dielectric material, a buffer layer (not shown) may be disposed between the substrate 110 and the gate insulating layer 114. The buffer layer may include silicon oxide and/or silicon oxynitride. The buffer layer may improve quality of an interface between the substrate 110 and the gate insulating layer 114. The gate electrode 116 may include, e.g., polysilicon and/or metal. The silicide layer 118 may include a metal silicide. The capping layer 120 may include, e.g., silicon nitride and/or silicon oxynitride.

As illustrated in FIG. 1, when the upper surface 132u of the drain region 132d' in the second region B is recessed to be lower than that of the substrate 110 under the gate pattern 121', a capping layer 120' in the second region B may be partially removed. That is, the capping layer 120' of the gate pattern 121' in the second region B may have a smaller width, e.g., along the x-axis, than those of the gate insulating layer 114, the gate electrode 116, and the silicide layer 118 of the gate pattern 121' in the second region B. In other words, the capping layer 120' may only partially cover the silicide layer 118 in the second region B, e.g., as compared to the structure of the gate pattern 121 in the first region A.

As further illustrated in FIG. 1, spacers 130 may be disposed on sidewalls of the gate pattern 121 in the first region A. The spacer 130 may include, e.g., silicon oxide and/or silicon oxynitride. The gate pattern 121' in the second region B may include the spacer 130 on one sidewall and a spacer 130' on another sidewall, i.e., on a sidewall adjacent to a recessed region. The spacer 130' may include a first spacer portion 130a on the capping layer 120' and a second spacer portion 130b on a remaining sidewall of the gate pattern 121'.

In detail, since the upper surface 132u of the drain region 132d' in the second region B is lower than that of the substrate 110 under the gate pattern 121', a recessed region 110b may be defined in the substrate 110 in the second region B to accommodate the drain region 132d' therein. In other words, the drain region 132d' may be formed in the recessed region 110b of the substrate 110. The spacer 130' on the sidewall of the gate pattern 121' adjacent to the recessed region 110b may be downwardly extended onto a first sidewall of the recessed region 110. For example, the second spacer portion 130b may extend, e.g., continuously, along the sidewall of the gate pattern 121' and along a first sidewall of the recessed region 110b to contact the upper surface 132u of the drain region 132d'. For example, the second spacer portion 130b may extend on at least two opposite sidewalls, e.g., on all sidewalls, of the recessed region 110b. For example, a second sidewall of the recessed region may be opposite to the first sidewall and may be laterally spaced apart, e.g., along the x-axis, from the gate pattern 121. The first and second spacer portions 130a and 130b may be discontinuous with respect to each other.

The semiconductor device 100 may further include an interlayer insulating layer 140, contact plugs 145 penetrating the interlayer insulating layer 140, and metal interconnections 150. The interlayer insulating layer 140 may cover the gate patterns 121, 121' in the first and second regions A and B. The contact plugs 145 may be electrically connected to the source region 122s and 132s and the drain region 122d and 132d in the first region A and the source region 122s and 132s and the drain region 132d' in the second region B, respectively. The metal interconnections 150 may be electrically connected to the contact plugs 145, respectively.

Although not shown, an etch stop layer for formation of contact plugs having heights different from each other may be disposed between the interlayer insulating layer 140 and the substrate 110. In this case, the contact plugs 145 may sequentially penetrate the interlayer insulating layer 140 and the etch stop layer.

Since the drain region 132d' in the second region B corresponding to the high voltage region may have the upper surface 132d' lower in level than that of the substrate 110 under the gate pattern 121', the high voltage transistor in the second region B may have improved withstand voltage characteristic for a high voltage applied to the drain region 132d'.

Semiconductor devices according to other embodiments of the inventive concept will be hereinafter described with reference to FIGS. 2 to 5. In the embodiments illustrated in FIGS. 2 to 5, for convenience in explanation, detailed descriptions of same elements as in the above embodiment will be omitted or mentioned briefly. That is, differences between the embodiments in FIG. 1 and each of the embodiments in FIGS. 2 to 5 will be mainly described hereinafter.

Figure 2:
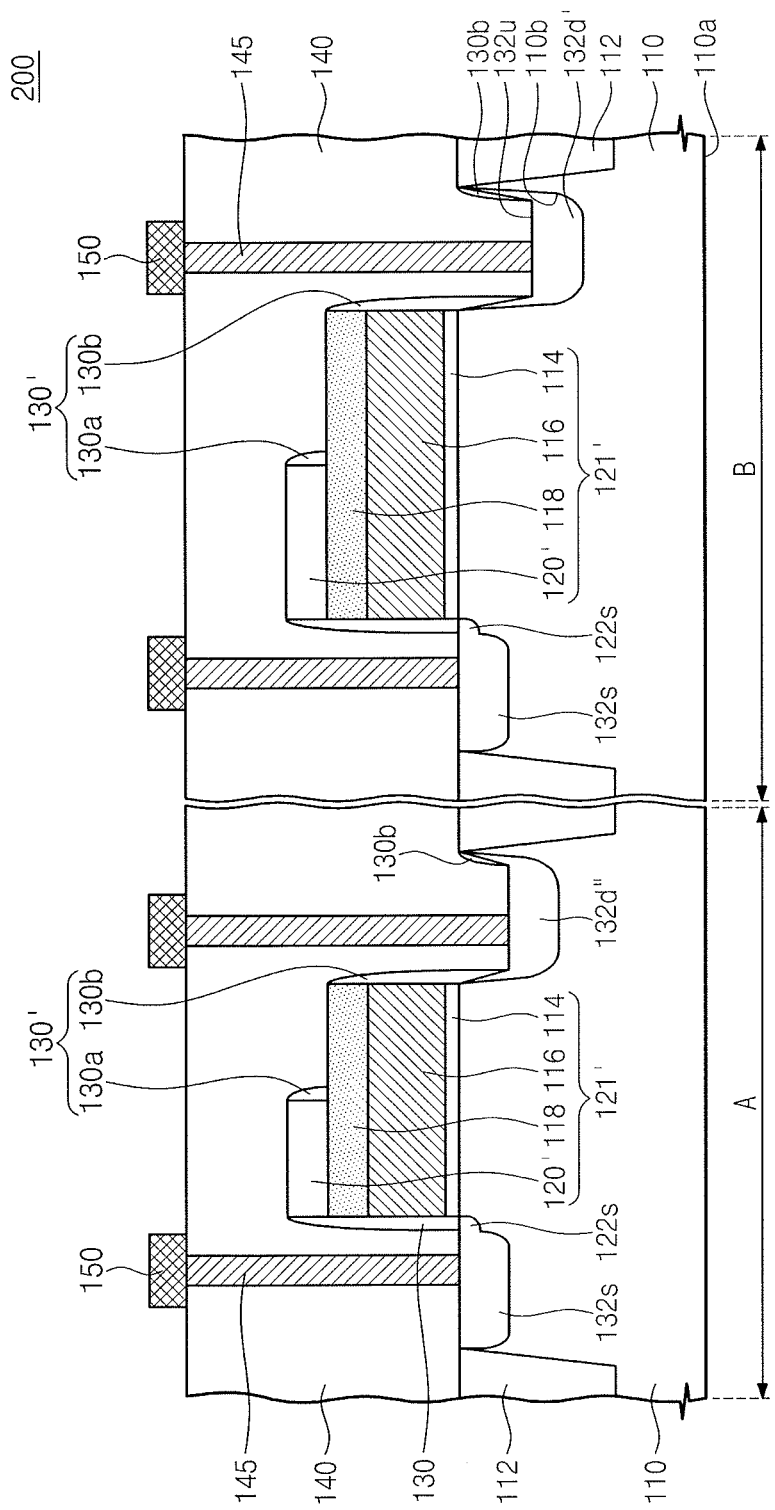

FIG. 2 illustrates a cross sectional view of a semiconductor device according to another embodiment. Referring to FIG. 2, a semiconductor device 200 may be substantially the same as the semiconductor device 100 in FIG. 1, with the exception of having a different structure of the first region A.

As illustrated in FIG. 2, a drain region 132d''' in the first region A being the low voltage region may have an upper surface lower in level than that of the substrate 110 under the gate pattern 121, like the drain region 132d' in the second region B being the high voltage region. In present embodiment, the drain region 132d''' in the first region A may not include a low concentration drain region. However, the inventive concept is not limited thereto. For example, the drain region 132*d*" of the first region A illustrated in FIG. 2 may further include the low concentration drain region.

Since the drain region 132*d*" in the first region A may have the upper surface lower than that of the substrate 110 under the gate pattern 121', the low voltage transistor in the first region A may have improved withstand voltage characteristic for a voltage applied to the drain region 132*d*".

The voltage applied to the drain region 132*d*" of the low voltage transistor in the first region A may be lower than the voltage applied to the drain region 132*d'* of the high voltage transistor in the second region B. Thus, the upper surface of the drain region 132*d*" in the first region A may be higher than that of the drain region 132*d'* in the second region B.

Figure 3:
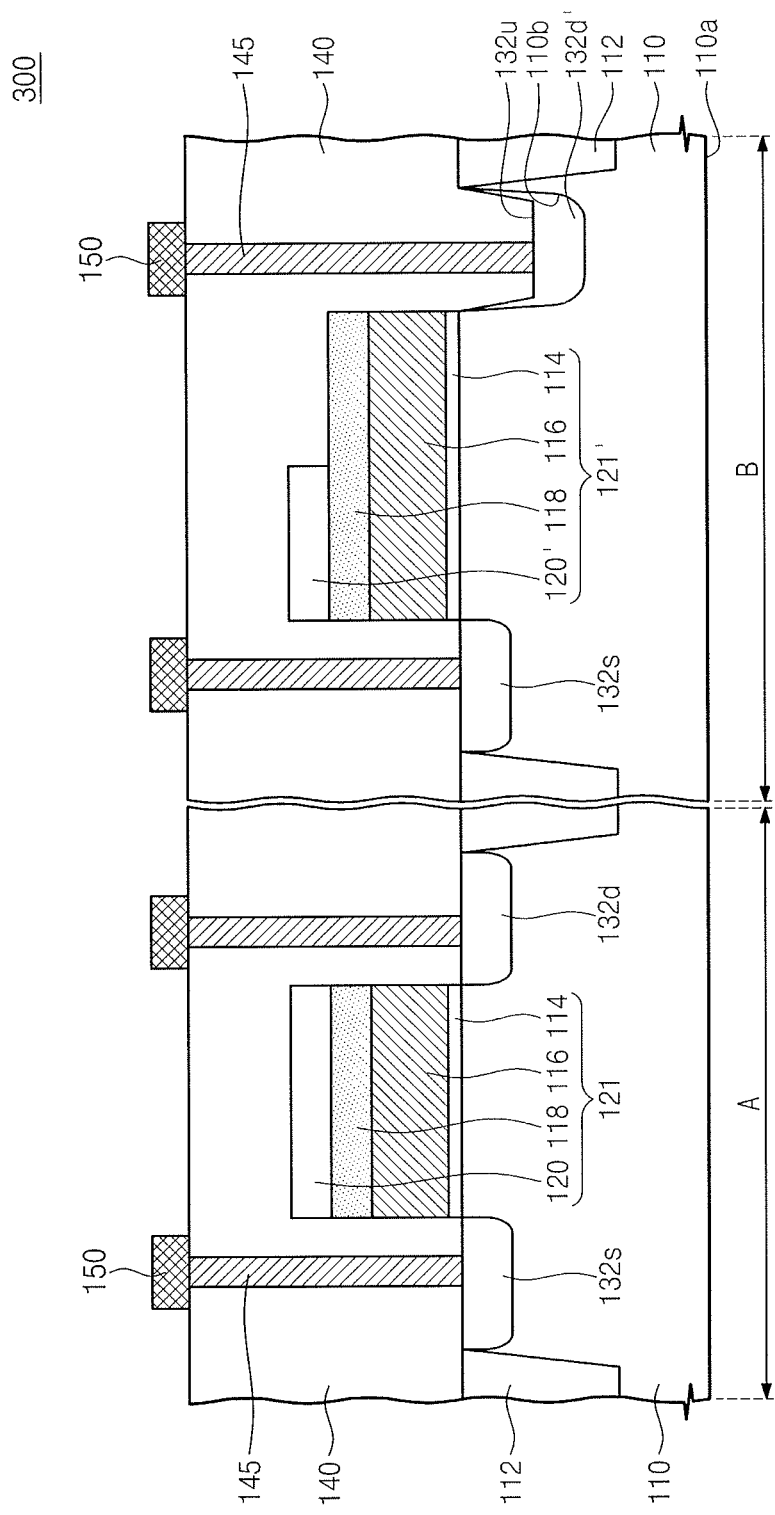

FIG. 3 illustrates a cross sectional view of a semiconductor device according to another embodiment. Referring to FIG. 3, a semiconductor device 300 may be substantially the same as the semiconductor device 100 in FIG. 1, with the exception of not including spacers disposed on sidewalls of the gate patterns 121, 121'.

Since the semiconductor device 300 does not include spacers, the source region 132*s* in each of the first and second regions A and B may be the high concentration source region, and the drain regions 132*d*, 132*d'* in the first and second region A and B may be the high concentration drain regions. That is, the source region 132*s* may not have the low concentration source region, and the drain regions 132*d*, 132*d'* may not have the low concentration drain region.

However, the upper surface 132*u* of the drain region 132*d'* in the second region B may be recessed to be lower in level than that of the substrate 110 under the gate pattern 121' in the second region B, so that the recessed region may be formed on the upper surface of the drain region 132*d'* in the second region B. The recessed region may have an inclined sidewall adjacent to the gate pattern 121' in the second region B. A portion of the drain region 132*d'*, which is adjacent to the inclined sidewall of the recessed region, may have a characteristic of a low concentration. As a result, since the drain region 132*d'* in the second region B may include the portion being adjacent to the inclined sidewall of the recessed region and having the characteristic of a low concentration, the high voltage transistor in the second region B may have improved withstand voltage characteristic for the high voltage applied to the drain region 132*d'* in the second region B. Also, since the semiconductor device 300 does not have spacers, reduction of current in the source regions 132*s* in the first and second regions A and B may be minimized.

Figure 4:
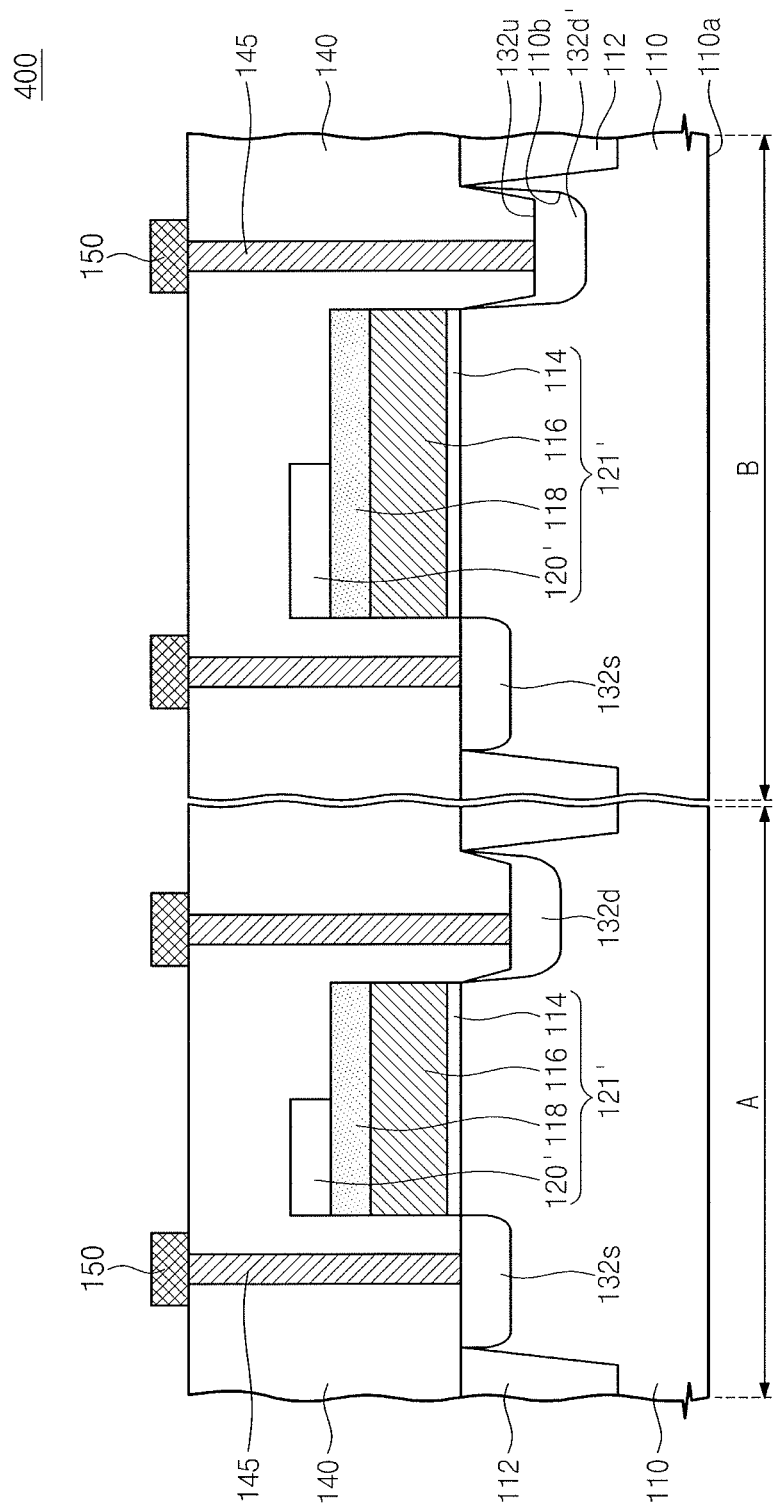

FIG. 4 illustrates a cross sectional view of a semiconductor device according to another embodiment. Referring to FIG. 4, a semiconductor device 400 may be substantially the same as the semiconductor device 100 in FIG. 1, with the exception of having an active region of the first region A with a different structure, e.g., as compared with that of the semiconductor device 100, and not including spacers.

A drain region 132*d*" in the first region A being the low voltage region may have an upper surface lower in level than that of the substrate 110 under the gate pattern 121. The voltage applied to the drain region 132*d*" of the low voltage transistor in the first region A may be lower than the voltage applied to the drain region 132*d'* of the high voltage transistor in the second region B. Thus, the upper surface of the drain region 132*d*" in the first region A may be higher than that of the drain region 132*d'* in the second region B.

Since the semiconductor device 400 may not include the spacers, the source region 132*s* may be substantially the high concentration source region, and the drain region 132*d* may be substantially the high concentration drain region. That is, the source region 132*s* may not have the low concentration source region, and the drain region 132*d* may not have the low concentration drain region.

However, the upper surfaces of the drain regions 132*d*", 132*d'* in the first and second regions A and B may recessed to be lower in level than the that of the substrate 110 under each of the gate patterns 121,121', so that the recessed regions may be formed on the upper surfaces of the drain regions 132*d*", 132' in the first and second regions A and B. Each of the recessed regions may have an inclined sidewall adjacent to a respective gate pattern 121, 121'.

Each of the drain regions 132*d*", 132*d'* in the first and second regions A and B may have the portion being adjacent to the inclined sidewall of each of the recessed regions and having the characteristic of the low concentration. As a result, the drain regions 132*d*", 132*d'* in the first and second regions A and B may be lower than that of the substrate 110 under each of the gate patterns 121,121' and each of the drain regions 132*d*", 132*d'* in the first and second regions A and B may have the portion being adjacent to the inclined sidewall of the recessed region and having the characteristic of the low concentration. Thus, the low voltage transistor and the high voltage transistor in the first and second regions A and B may have improved withstand voltage characteristic for the voltages applied to the drain regions 132*d*", 132*d'*. Also, since the semiconductor device 400 may not have the spacers, reduction of currents in the source regions 132*s* in the first and second regions A and B may be minimized.

Figure 5:
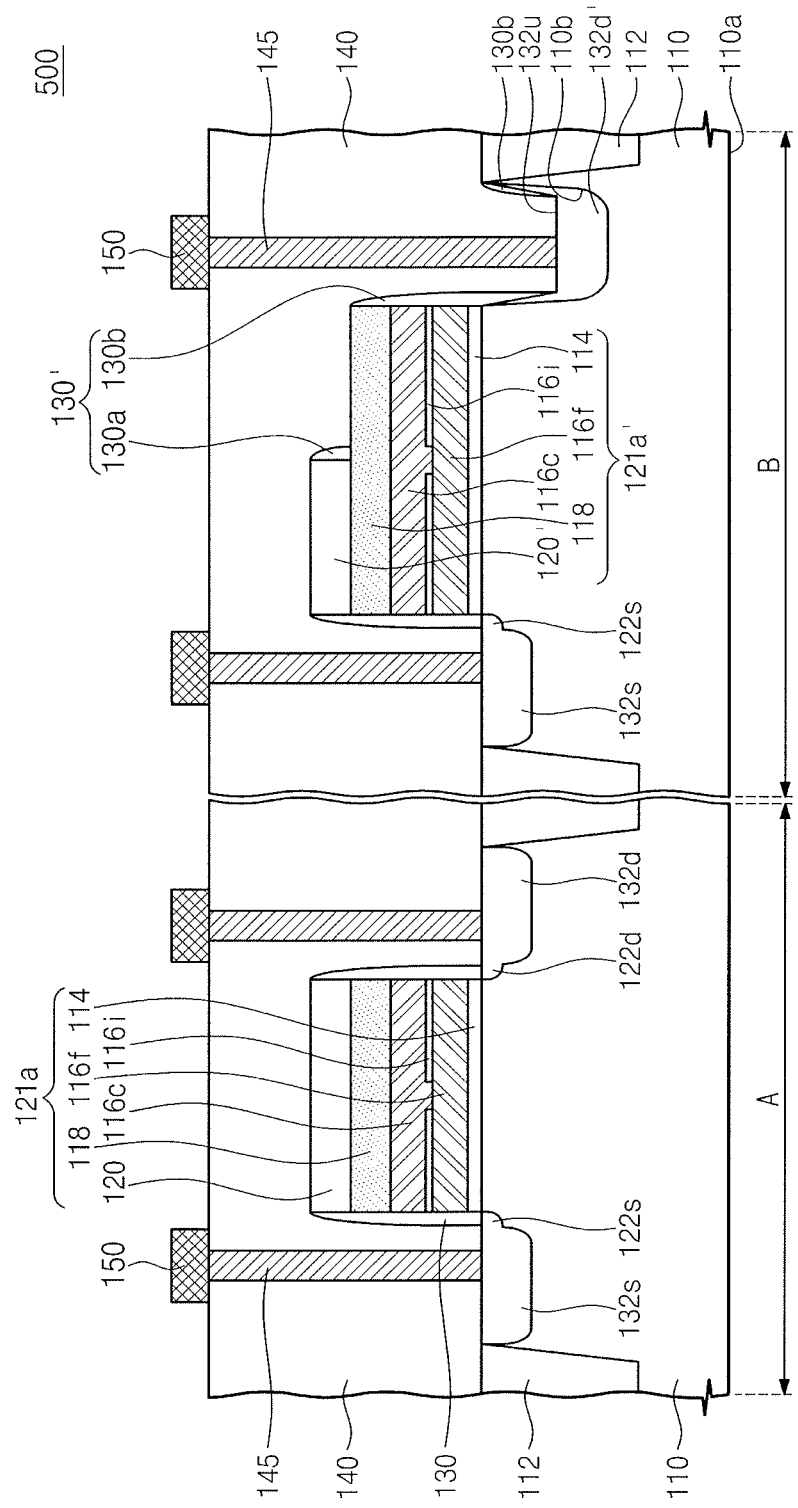

FIG. 5 illustrates a cross sectional view of a semiconductor device according to another embodiment. Referring to FIG. 5, a semiconductor device 500 may be substantially the same as the semiconductor device 100 in FIG. 1, with the exception of including gate patterns having a different structure, e.g., as compared with that of the semiconductor device 100.

A gate pattern 121*a* in the first region A may include the gate insulating layer 114, a lower gate pattern 116*f*, an insulating pattern 116*i*, an upper gate pattern 116*c*, the silicide pattern 118, and the capping layer 120 sequentially stacked on the substrate 110. The upper gate pattern 116*c* may penetrate the insulating pattern 116*i* to be electrically connected to the lower gate pattern 116*f*. The insulating pattern 116*i* may include a triple-layer of a silicon oxide layer/a silicon nitride layer/a silicon oxide layer. A gate pattern 121*a'* in the second region B may be substantially the same as that of the gate pattern 121*a*, with the exception of the width of the capping layer 120' discussed previously with reference to FIG. 1.

For example, the semiconductor device 500 illustrated in FIG. 5 may be a NAND flash memory device. The first and second regions A and B including the lower gate patterns 116*f*, the insulating patterns 116, and the upper gate patterns 116*c* may be included in a peripheral circuit region of the NAND flash memory device. The lower gate patterns 116*f*, the insulating patterns 116, and the upper gate patterns 116*c* may include the same materials as a floating gate pattern, an integrate insulating pattern, and a control gate pattern of a memory cell in a cell region of the NAND flash memory device, respectively.

Since the upper surface of the drain region 132*d'* in the second region B may be recessed to be lower in level than the that of the substrate 110 under the gate pattern 121*a'* in the second region B, the recessed region having the inclined sidewall adjacent to the gate pattern 121*a'* may be formed on the upper surface of the drain region 132*d'* in the second region B. Thus, the drain region 132*d'* in the second region B may have the portion which is adjacent to the inclined sidewall of the recessed region and has the characteristic of a low concentration. As a result, the high voltage transistor in the second region B may have improved withstand voltage characteristic for the high voltage applied to the drain region 132*d'* in the second region B.

A semiconductor device according to embodiments of the inventive concept may include a transistor with source and drain regions having a recessed structure, which are asymmetric with respect to the gate pattern. Thus, the transistor may have improved withstand voltage characteristic for the voltage applied to the drain region of the transistor. As a result, a semiconductor device including a transistor with improved withstand voltage characteristic may be realized.

FIGS. 6A to 6D illustrate cross sectional views of stages in a method of fabricating a semiconductor device according to an embodiment of the inventive concept.

Figure 6A:
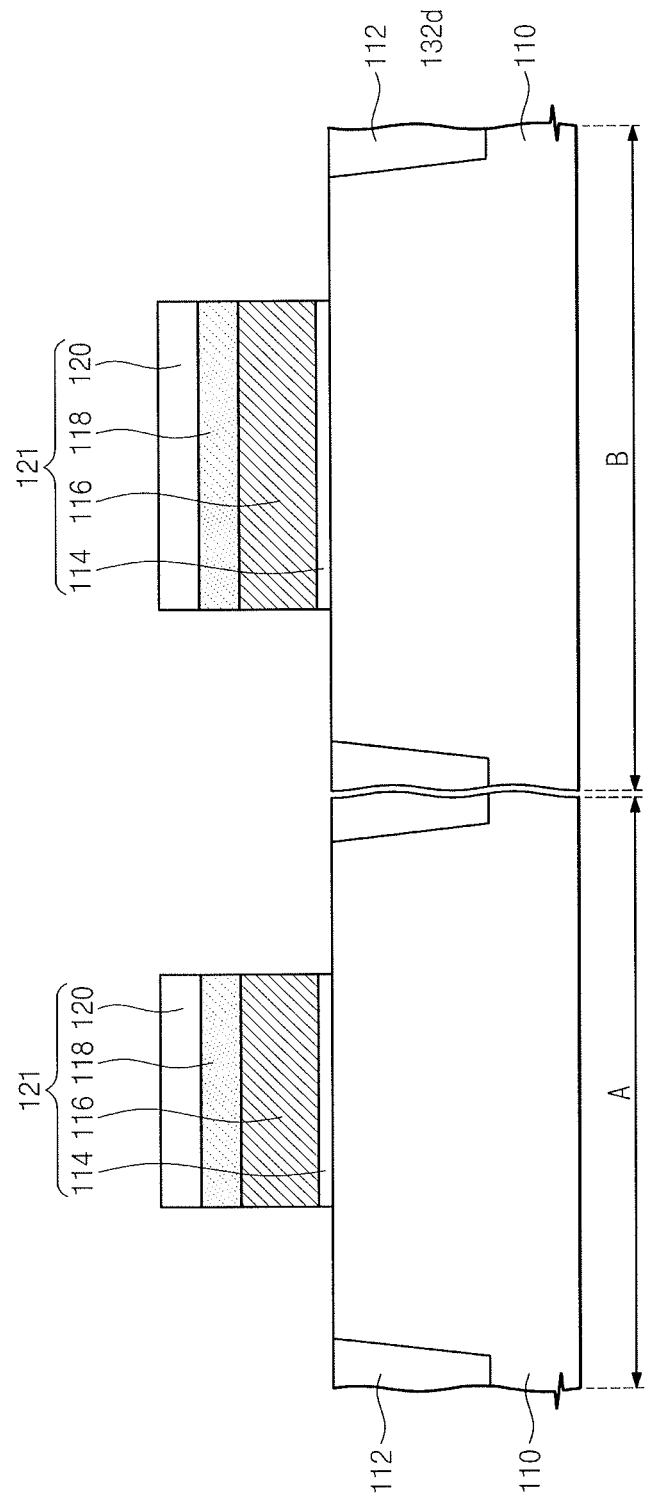
FIGS. 6A to 6D illustrate cross sectional views of stages in a method of fabricating a semiconductor device according to an embodiment of the inventive concept.

Referring to FIG. 6A, the device isolation layer 112 may be formed on the substrate 110 including the first and second regions A and B to define active regions in the first and second regions A and B, respectively. The gate patterns 121, 121' may be formed to respectively cross over the active regions on the substrate 110.

The substrate 110 may be a silicon substrate. The first region A and the second region B may be a low voltage region and a high voltage region in a peripheral circuit region of the semiconductor device, respectively. The low voltage region may be a region on which a low voltage transistor is formed, and the high voltage region may be a region on which a high voltage transistor is formed.

A gate insulating layer, a gate electrode layer, a silicide layer, and a capping layer may be sequentially formed on an entire surface of the substrate 110. And then, the capping layer, the silicide layer, the gate electrode layer, and the gate insulating layer may be successively patterned to form gate patterns 121. Thus, the gate pattern 121 may include the gate insulating layer 114, the gate electrode 116, the silicide layer 118, and the capping layer 120 which are sequentially stacked.

The gate insulating layer 114 may include silicon oxide and/or a high-k dielectric material. The silicon oxide of the gate insulating layer 114 may be formed using a wet thermal oxidation process, a dray thermal oxidation process, and/or a chemical vapor deposition (CVD) process. The high-k dielectric material may have a dielectric constant higher than that of silicon oxide. The dielectric constant of the high-k dielectric material may be equal to or larger than 10. The high-k dielectric material may include an oxide having at least one metal (e.g. hafnium (Hf), zirconium (Zr), aluminum (Al), titanium (Ti), lanthanum (La), yttrium (Y), gadolinium (Gd) or tantalum (Ta), etc.), aluminate, and/or silicate. The gate insulating layer 114 including the high-k dielectric material may be single layered or multi layered.

When the gate insulating layer 114 includes the high-k dielectric material, a buffer layer (not shown) may be formed between the substrate 110 and the gate insulating layer 114. The buffer layer may include silicon oxide and/or silicon oxynitride. The buffer layer may improve quality of an interface between the substrate 110 and the gate insulating layer 114. The gate electrode 116 may include polysilicon and/or metal. The silicide layer 118 may include a metal silicide. The capping layer 120 may include silicon nitride and/or silicon oxynitride.

Figure 6B:
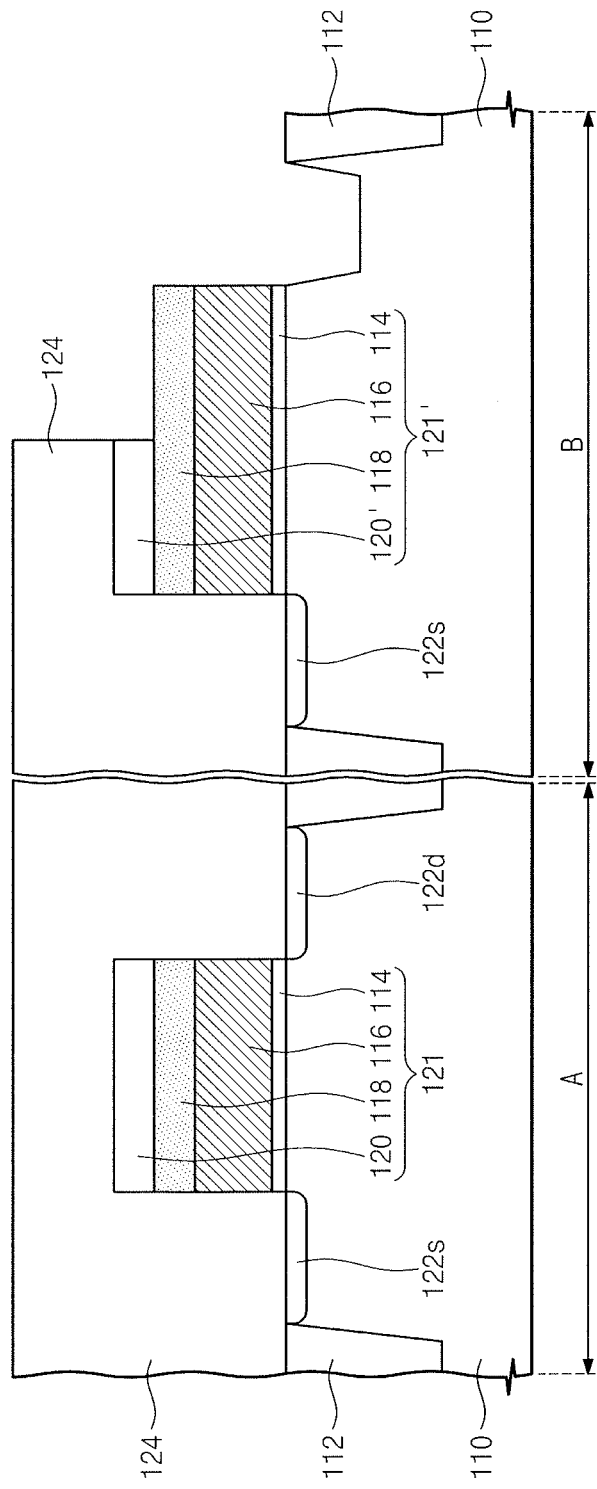

Referring to FIG. 6B, an ion implantation process with a low dose may be performed using the gate pattern 121 as mask to form first and second low concentration dopant regions 122*s* and 122*d* in the substrate 110 of the active region at both sides of each gate pattern 121. The first low concentration dopant region 122*s* and the second low concentration dopant region 122*d* may be the low concentration source region 122*s* and a low concentration drain region 122*d* of a transistor, respectively.

A photoresist pattern 124 may be formed on the substrate 110 in which the first and second dopant regions 122*s* and 122*d* are formed. The photoresist pattern 124 may cover an entire surface of the first region A and a portion of the second region B. The photoresist pattern 124 may expose the low concentration drain region (not shown) in the second region B, i.e., a region where the recessed region 110*b* is to be formed.

The exposed low concentration drain region in the second region B may be etched using the photoresist pattern 124 as an etch mask. Thus, an upper surface of the substrate 110, in which the low concentration drain region in the second region B is formed, may be recessed to be lower than that of the substrate 110 under the gate pattern 121. Thus, the recessed region 110*b* may be formed at a side of the gate pattern 121 in the second region B. In this case, during formation of the recessed region 110*b*, the low concentration drain region may be completely removed from the substrate 110, or a portion of the low concentration drain region may remain under a sidewall of the recessed region 110*b* (not shown). Also, a portion of the capping layer 120 of the gate pattern 121 in the second region B may be removed to form the capping layer 120' of the gate pattern 121' in the second region B, which may have a width narrower than those of the gate insulating layer 114, the gate electrode 116, and the silicide layer 118 in the second region B.

At least one of upper surfaces of the substrate 110 in the active region, in which the low concentration source and drain regions 122*s* and 122*d* in the second region B are formed, may be recessed to be lower than that of the substrate 110 under the gate pattern 121'. For example, as illustrated in FIG. 6B, only the upper surface of the substrate 110 in the active region, in which the recessed region 110*b* in the second region B is formed, may be recessed. However, the inventive concept is not limited thereto. The upper surface of the substrate 110 in the active region, in which the low concentration source region 122*s* in the second region B is formed, may be also recessed. In this case, the recessed surface of the substrate 110 at one side of the gate pattern 121' may be lower than the recessed surface of the substrate 110 at another side of the gate pattern 121', i.e., an upper surface of a drain region may be lower than an upper surface of a source region. That is, the low concentration source and drain regions in the second region B may have a recessed structure being asymmetric with respect to the gate pattern 121' in the second region B.

Figure 6C:
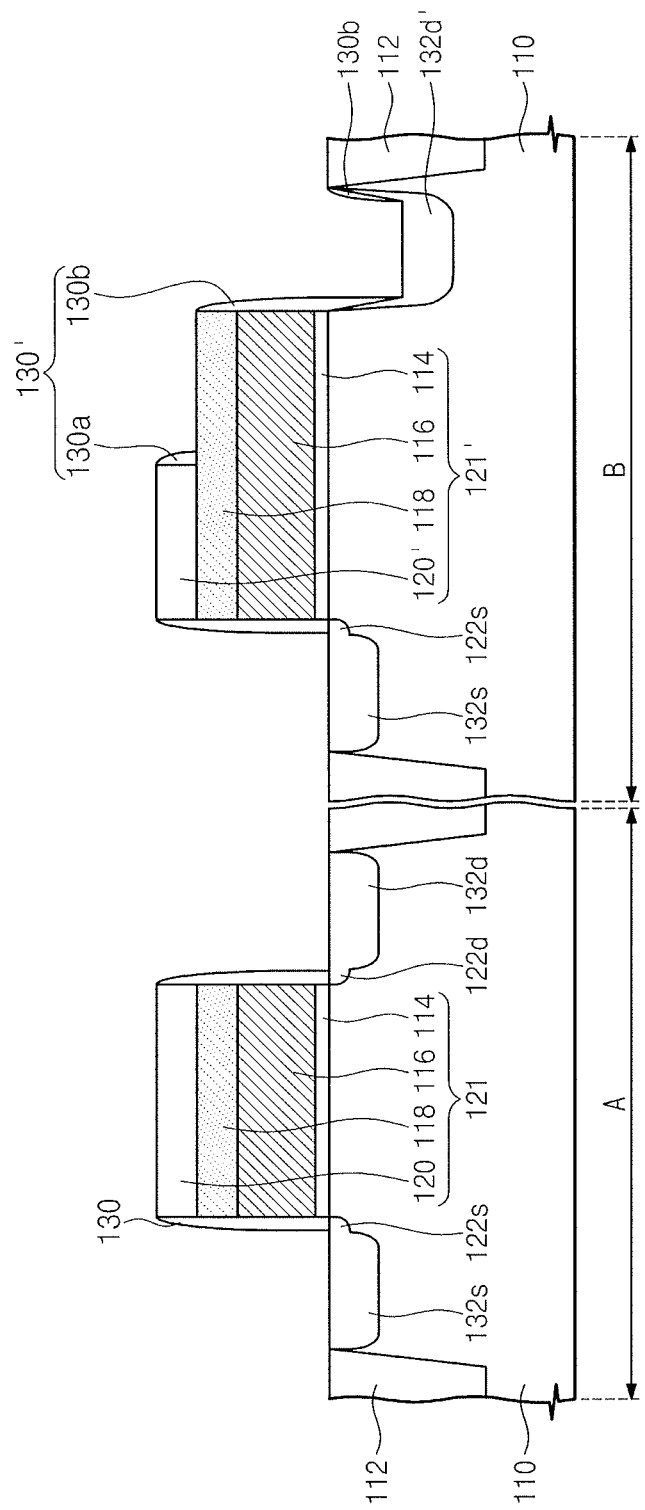

Referring to FIG. 6C, after the photoresist pattern 124 is removed, spacers 130, 130' may be formed on both sidewalls of the gate pattern 121, 121'. The spaces 130, 130' may include silicon oxide and/or silicon oxynitride. The spacers 130' may be further formed on sidewalls of the recessed region. For example, the spacer 130' on the sidewall of the gate pattern 121' adjacent to the recessed region may be extended onto the sidewall of the recess region 110*b* adjacent to the gate pattern 121'. Also, the spacer 130' may be formed on the sidewall of the recessed region 110*b* which is laterally spaced apart from the gate pattern 121'. Additionally, the spacer 130' may be further formed on a sidewall of the partially removed capping layer 120' in the second region B.

An ion implantation process with a high dose may be performed using the gate pattern 121, 121' and the spacer 130, 130' as a mask to form a first high concentration dopant region 132*s* and a second high concentration dopant region 132*d*, 132' in the substrate 110 of the active region at both sides of each of the gate patterns 121, 121'.

Thus, a first dopant region 122s and 132s and a second dopant region 122s and 132d may be formed in the substrate 110 of the active region at both sides of the gate pattern 121. The first dopant region 122s and 132s and the second dopant region 122d and 132d may be a source region and a drain region of the transistor, respectively. The source region 122s and 132s may include the low concentration source region 122s and the high concentration source region 132s. The drain region 122d and 132d may include the low concentration drain region 122d and the high concentration drain region 132d.

As described with reference to the FIG. 6B, when the low concentration drain region in the second region B is completely removed, the drain region 132d' in the second region B may be the high concentration drain region. Alternatively, when a portion of the low concentration drain region in the second region B remains, the drain region 132d' in the second region B may further include a portion of the low concentration drain region 122d.

Figure 6D:
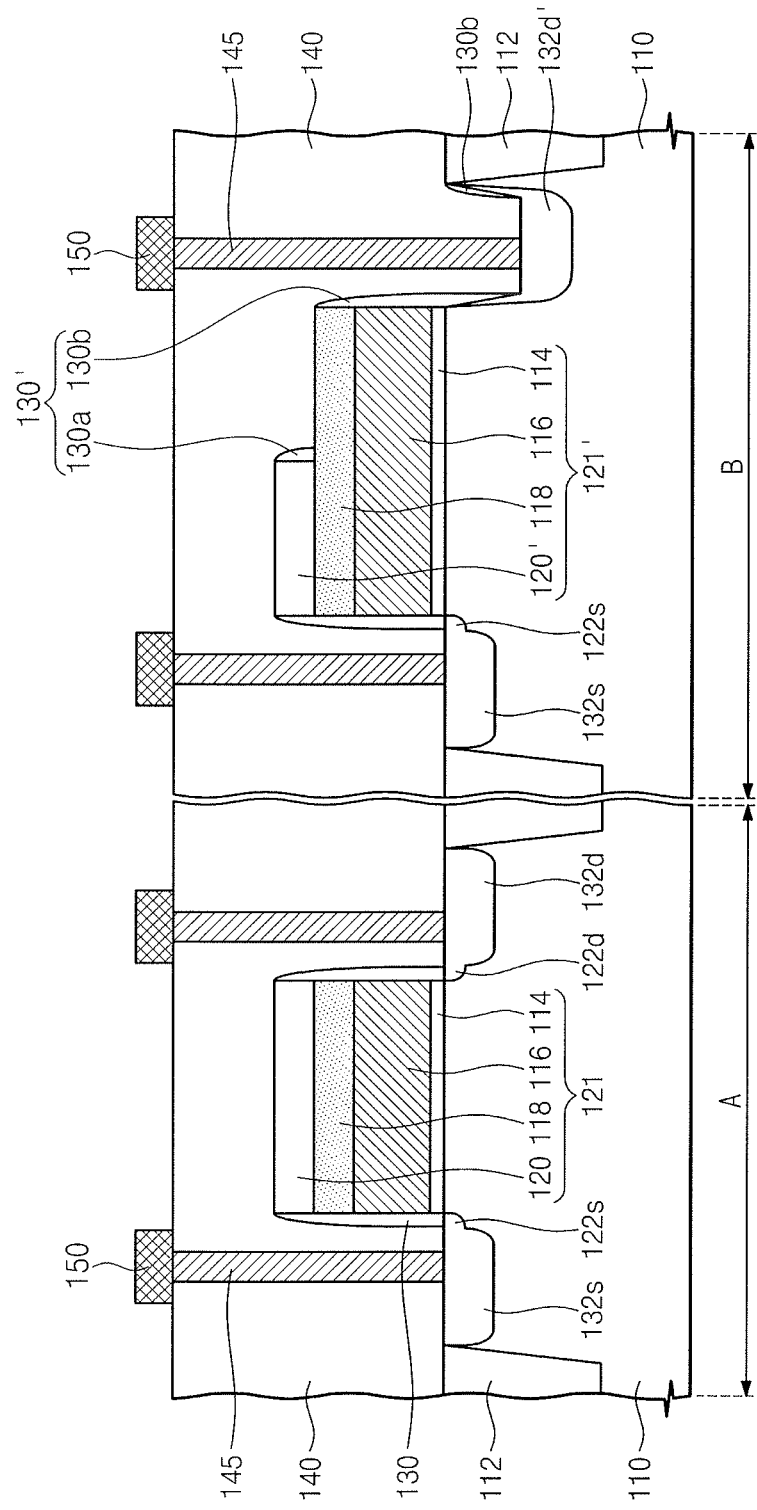

Referring to FIG. 6D, an interlayer insulating layer 140 may be formed to cover the substrate 110, in which the source region 122s and 132s and the drain regions 122d 132d, and 132d' are formed. The interlayer insulating layer 140 may include silicon oxide.

Contact plugs 145 may be formed to penetrate the interlayer insulating layer 140. The contact plugs 145 may be electrically connected to the source region 122s and 132s and the drain regions 122d, 132d, and 132d' respectively. The contact plugs 145 may include metal.

Although not shown, before the interlayer insulating layer 140 is formed, an etch stop layer may be formed to cover the substrate 110. The etch stop layer may be used for formation of contact plugs 145 having different height from each other.

Metal interconnections 150 electrically connected to the contact plugs 145 may be formed on the interlayer insulating layer 140. The metal interconnections 150 may include metal.

Since the drain region 132d' in the second region B, being the high voltage region, may have the upper surface lower in level than that of the substrate 110 under the gate pattern 121, the high voltage transistor in the second region B may have improved withstand voltage characteristic for a high voltage applied to the drain region 132d'.

FIGS. 7A to 7E are cross sectional views of stages in a method of fabricating a semiconductor device according to another embodiment of the inventive concept. In the present embodiment, detailed descriptions of same elements as described in the above embodiment will be omitted or mentioned briefly.

Referring to FIG. 7A, the device isolation layer 112 may be formed on the substrate 110 having the first and second regions A and B to define the active region in each of the first and second regions A and B. Gate patterns 121 may be formed to cross over the device isolation layers 112 the first and second regions A and B, respectively.

The first region A and the second region B may be a low voltage region and a high voltage region in a peripheral circuit region of a semiconductor device, respectively. The low voltage region may be a region on which a low voltage transistor is formed, and the high voltage region may be a region on which a high voltage transistor is formed.

Figure 7B:
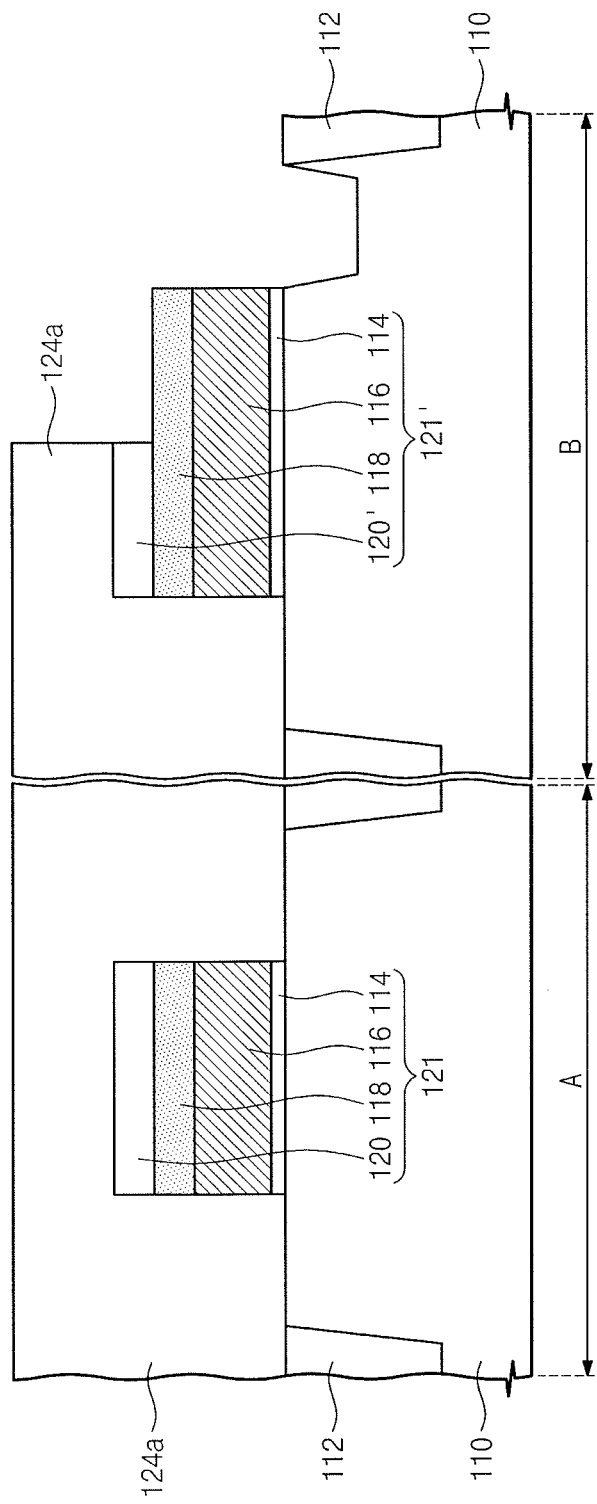

Referring to FIG. 7B, a first photoresist pattern 124a may be formed on the substrate 110 on which the gate patterns 121 are formed. The first photoresist pattern 124a may cover an entire surface of the first region A and a portion of the second region B. The first photoresist pattern 124a may expose the substrate 110 of the active region disposed at a side of the gate pattern 121 in the second region B. The drain region (132d' in FIG. 7D) of the transistor in the second region B will be formed in the portion of the exposed substrate 110 in the active region of the second region B.

The exposed substrate 110 in the active region of the second region B may be etched using the first photoresist pattern 124a as an etch mask. Thus, the exposed substrate 110 in the active region of the second region B may be recessed to form the recess region 110b. In this case, the capping layer 120 of the gate pattern 121 in the second region B may be partially removed. That is, the resultant capping layer 120' of the gate pattern 121' in the second region B may have a width narrower than those of the gate insulating layer 114, the gate electrode 116, and the silicide layer 118 in the second region B.

At least one of the upper surfaces of the substrate 110 of the active region disposed at both sides of the gate pattern 121' in the second region B may be recessed to be lower than that of the substrate 110 under the gate pattern 121'. The source region (132s in FIG. 7D) and the drain region of the transistor in the second region B will be formed in the substrate 110 of the active region at both sides of the gate pattern 121' in the second region B, respectively. The upper surface of the substrate 110 of the active region at one side of the gate pattern 121' in the second region B is recessed in FIG. 7B. However, the inventive concept is not limited thereto. The upper surface of the substrate 110 of the active region at another side of the gate pattern 121' in the second region B may be also recessed to be lower than that of the substrate under the gate pattern 121'. In this case, the recessed surface of the substrate 110 in the active region, in which the drain region in the second region B will be formed, may be lower than the recessed surface of the substrate 110 in the active region in which the source region in the second region B will be formed. That is, the active region in the second region B, in which the source and drain regions in the second region B will be formed, may have an asymmetric recessed structure with respect to the gate pattern 121' in the second region B.

Figure 7C:
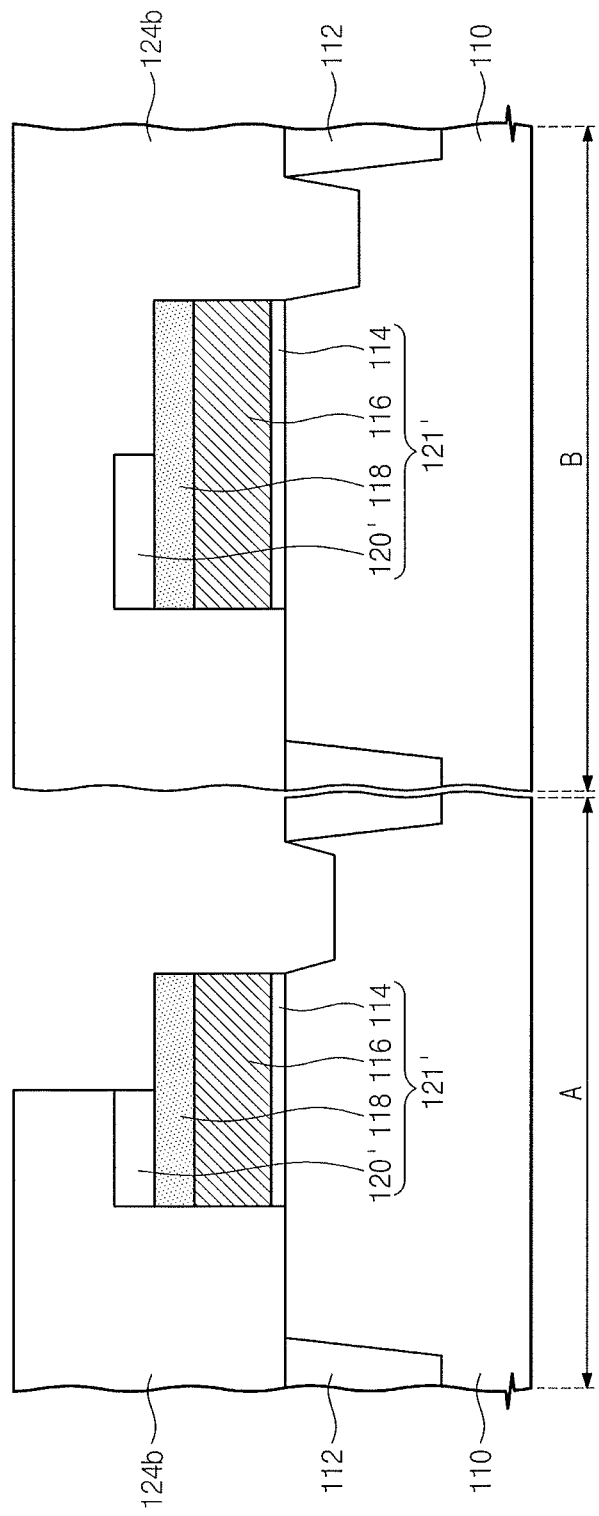

Referring to FIG. 7C, after the first photoresist pattern 124a is removed, a second photoresist pattern 124b may be formed. The second photoresist pattern 124b may cover an entire surface of the second region B and a portion of the first region A. The second photoresist pattern 124b may expose the substrate 110 of the active region disposed at a side of the gate pattern 121 in the first region A. The drain region (132d" in FIG. 7D) of the transistor in the first region A will be formed in the exposed substrate 110 in the active region of the first region A.

The exposed substrate 110 in the active region of the first region A may be etched using the second photoresist pattern 124b as an etch mask. Thus, the exposed substrate 110 in the active region of the first region A may be recessed to form a recess region. In this case, the capping layer 120 of the gate pattern 121 in the first region A may be partially removed. That is, the resultant capping layer 120' of the gate pattern 121' in the first region A may have a width narrower than those of the gate insulating layer 114, the gate electrode 116, and the silicide layer 118 in the first region A.

At least one of the upper surfaces of the substrate 110 of the active region disposed at both sides of the gate pattern 121' in the first region A may be recessed to be lower than that of the substrate 110 under the gate pattern 121'. The source region (132s in FIG. 7D) and the drain region in the first region A will be formed in the substrate 110 of the active region at both sides of the gate pattern 121' in the first region A, respectively. The upper surface of the substrate 110 of the active region at one side of the gate pattern 121' in the first region A is recessed in FIG. 7C. However, the inventive concept is not limited thereto. The upper surface of the substrate 110 of the active region at another side of the gate pattern 121' in the first region A may be also recessed to be lower than that of the substrate under the gate pattern 121'. In this case, the recessed surface of the substrate 110 at one side of the gate pattern 121', in which the drain region in the first region A will be formed, may be lower than the recessed surface of the substrate 110 at another side of the gate pattern 121', in which the source region in the first region A will be formed. That is, the active region in the first region A, in which the source and drain regions in the first region A will be formed, may have a structure being asymmetrically recessed with respect to the gate pattern 121' in the first region A.

The voltage applied to the drain region of the low voltage transistor in the first region A may be lower than the voltage applied to the drain region of the high voltage transistor in the second region B. Thus, the recessed surface of the substrate 110, in which the drain region in the first region A will be formed, may be higher than the recessed surface of the substrate 110 in which the drain region in the second region B will be formed.

According to FIGS. 7B and 7C, the recessed regions in the first and second regions A and B may be formed using the first and second photoresist patterns 124a and 124b, respectively. Alternatively, the recessed regions in the first and second regions A and B may be formed using a single photoresist pattern. The single photoresist pattern may cover a portion of the first region A and a portion of the second region B. Thus, the single photoresist pattern may expose surfaces of the substrate 110 in which the drain regions in the first and second regions A and B will be formed. That is, the recessed regions of the first and second regions A and B may be formed using the single photoresist pattern and a single etch process. Thus, the exposed surfaces of the substrate 110 may be recessed to be lowered.

Figure 7D:
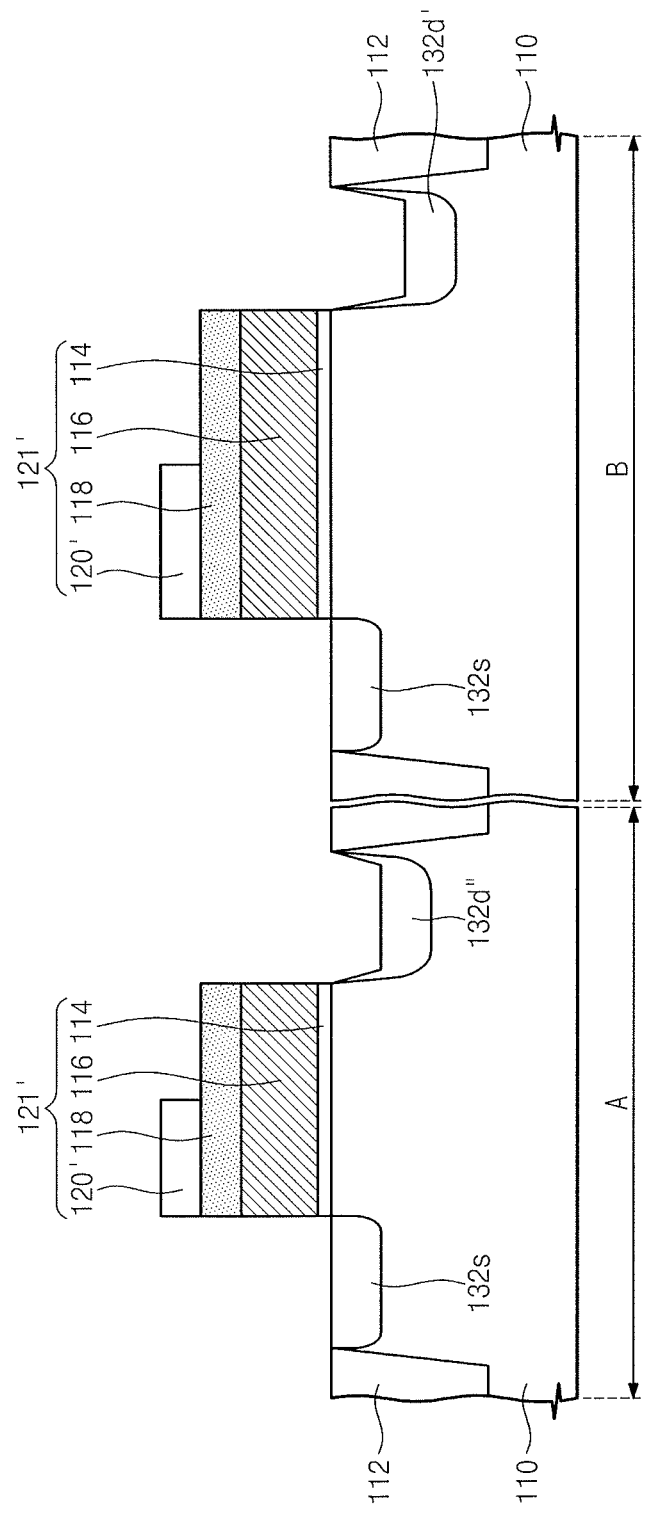

Referring to FIG. 7D, after the second photoresist pattern 124b is removed, an ion implantation process with a high dose may be performed using the gate pattern 121' as a mask to form the first and second dopant regions 132s and 132d''', 132d' in the substrate 110 of the active region at both sides of the gate pattern 121. The first dopant region 132s and the second dopant regions 132d''', 132' may be the source regions 132s and drain regions 132d''', 132d', respectively.

As a result, the drain regions 132d''' and 132d' in the first and second regions A and B may have upper surfaces lower than that of the substrate 110 under the gate pattern 121'. And the drain regions 132d''' and 132d' in the first and second regions A and B may include portions which have characteristic of the low concentration and are adjacent to inclined sidewalls of the recessed regions. Thus, the low voltage transistor and the high voltage transistor in the first and second regions A and B may have improved withstand voltage characteristic for voltages applied to the drain regions 132d.

Additionally, since the semiconductor device may not have spacers disposed on the gate patterns 121, reduction of currents in the source regions 132s may be minimized.

Figure 7E:
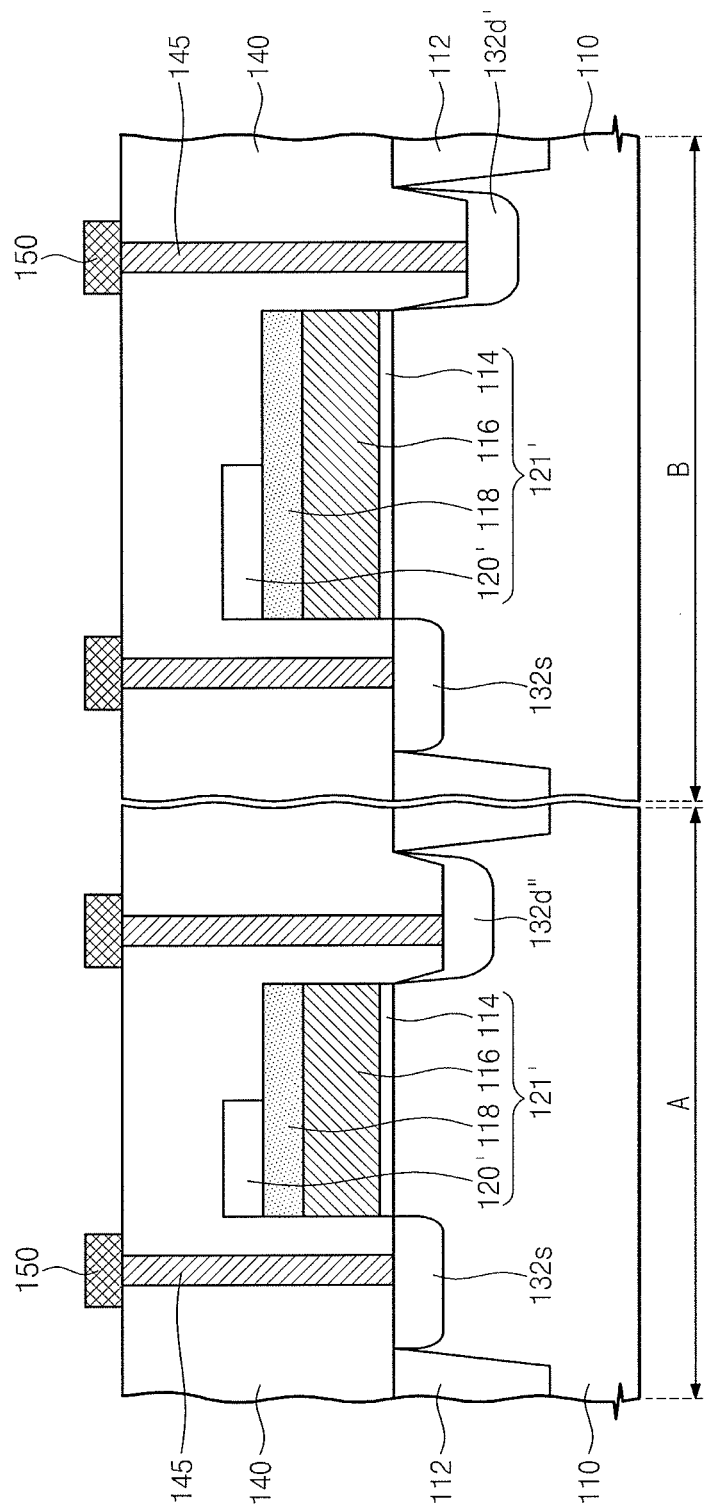

Referring to FIG. 7E, an interlayer insulating layer 140 may be formed to cover the substrate 110 in which the source and drain regions 132s and 132d''', 132d' are formed. Contact plugs 145 may be formed to penetrate the interlayer insulating layer 140. The contact plugs 145 may be electrically connected to the source and drain regions 132s and 132d''', 132d'. Although not shown, before the interlayer insulating layer 140 is formed, an etch stop layer may be formed to cover the substrate 110. The etch stop layer may be used for formation of contact plugs 145 having different height from each other. Metal interconnections 150 electrically connected to the contact plugs 145 may be formed on the interlayer insulating layer 140.

The upper surface of the drain region 132d''' in the first region A being the low voltage region, as well as that of the drain region 132d' in the second region B being the high voltage region, may be lower than that of the substrate 110 under the gate pattern 121. Thus, the low voltage transistor and the high voltage transistor in the first and second regions A and B may have improved withstand voltage characteristic for voltages applied to the drain regions 132d''', 132d'.

As a result, the drain regions 132d''' and 132d' in the first and second regions A and B being the low and high voltage regions may have upper surfaces lower than that of the substrate 110 under the gate pattern 121'. And the drain regions 132d''' and 132d' in the first and second regions A and B may have the portions being adjacent to the inclined sidewall and having the characteristic of the low concentration. Thus, the low voltage transistor and the high voltage transistor in the first and second regions A and B may have improved withstand voltage characteristic for the voltages applied to the drain regions 132d''' and 132d'.

Since the transistor of the semiconductor device manufactured by the method according to embodiments may include the source and drain regions having an asymmetrically recessed structure with respect to the gate pattern, the withstand voltage characteristic of the transistor may be improved for the voltage applied to the drain region. Thus, a semiconductor device including a transistor with improved withstand voltage characteristic may be realized. Additionally, according to some embodiments, the semiconductor device may not include spacers on sidewalls of the gate pattern, thereby simplifying the manufacturing processes. As a result, the semiconductor device including the transistor with improved withstand voltage characteristic may be realized using simplified processes.

In contrast, a semiconductor device with conventional transistors may have, e.g., a high voltage transistor with a wider spacer than that of a low voltage transistor, in order to minimize the high voltage transistor breakdown when a high drain voltage is applied thereto. However, when the width of the spacer of the high voltage transistor is increased for minimization of the breakdown, a resistance between a contact plug and a channel may be increased to reduce a current of the transistor. Also, since a distance between the contact plug and a gate may be reduced with a high integration of the semiconductor device, increase of the width of the spacer may be physically limited.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including a first region and a second region;

a device isolation layer on the substrate, the device isolation layer defining an active region in each of the first and second regions;

a gate pattern on the active region of each of the first and second regions, the gate pattern including a conductive layer and a capping layer on the conductive layer, at least the capping layer in the second region having a width narrower than a width of the conductive layer; and a first dopant region and a second dopant region in each of the first and second regions of the substrate, the gate pattern in each of the first and second regions being between respective first and second dopant regions, wherein at least one of upper surfaces of the first and second dopant regions in the second region is lower in level than an upper surface of the substrate under the gate pattern in the second region, the first and second dopant regions in the second region having an asymmetric recessed structure with respect to the gate pattern in the second region.

2. The semiconductor device as claimed in claim 1, wherein the first region and the second region are a low voltage region and a high voltage region, respectively.

3. The semiconductor device as claimed in claim 1, wherein the first dopant region and the second dopant region are a source region and a drain region, respectively.

4. The semiconductor device as claimed in claim 3, wherein an upper surface of the drain region is lower in level than an upper surface of the source region.

5. The semiconductor device as claimed in claim 1, further comprising spacers on sidewalls of each of the gate patterns.

6. The semiconductor device as claimed in claim 5, further comprising at least one recessed region adjacent the gate pattern in the second region, the at least one of the first and second dopant regions with the lower upper surface than the substrate being in the recessed region, and a spacer on a sidewall of the gate pattern adjacent the recessed region extending along a sidewall of the recessed region.

7. The semiconductor device as claimed in claim 1, wherein the conductive layer includes:

a lower conductive pattern;

an insulating pattern on the lower conductive pattern; and an upper conductive pattern on the insulating pattern, the upper conductive pattern penetrating the insulating pattern to be electrically connected to the lower conductive pattern.

8. The semiconductor device as claimed in claim 1, wherein a distance between a bottom of the substrate and the upper surface of the at least one lower dopant region is smaller than a distance between the bottom of the substrate and the upper surface of the substrate.

9. The semiconductor device as claimed in claim 1, wherein the upper surfaces of the first and second dopant regions in the second regions are at different heights relative to a bottom of the substrate.

10. A semiconductor device, comprising:

a substrate including a first region and a second region;

a first gate pattern on the first region, the first gate pattern being between a first dopant region and a second dopant region; and a second gate pattern on the second region, the second gate pattern having no spacers and being between a third dopant region and a fourth dopant region, at least one of the third and fourth dopant regions being in a recessed region of the substrate, and heights of upper surfaces of the third and fourth dopant regions relative to a bottom of the substrate being different from each other.

11. The semiconductor device as claimed in claim 10, wherein at least one of the upper surfaces of the third and fourth dopant regions in the second region is lower in level than an upper surface of the substrate under the gate pattern in the second region.

12. The semiconductor device as claimed in claim 11, wherein the first region and the second region are a low voltage region and a high voltage region, respectively, and the at least one of the third and fourth dopant regions with the lower upper surface being a drain region.

13. The semiconductor device as claimed in claim 10, wherein the gate pattern includes a conductive layer and a capping layer on the conductive layer, at least the capping layer in the second region having a width narrower than a width of the conductive layer.

* * * * *